United States Patent [19]

Galbraith

[11] Patent Number: 4,871,933
[45] Date of Patent: Oct. 3, 1989

[54] HIGH-SPEED STATIC DIFFERENTIAL SENSE AMPLIFIER

[75] Inventor: Douglas C. Galbraith, Fremont, Calif.

[73] Assignee: Actel Corporation, Sunnyvale, Calif.

[21] Appl. No.: 239,130

[22] Filed: Aug. 31, 1988

Related U.S. Application Data

[63] Continuation-in-part of Ser. No. 230,762, Aug. 10, 1988.

[51] Int. Cl.[4] .................. G01R 19/00; G06G 7/12; H03K 5/24
[52] U.S. Cl. ................................ 307/530; 307/279; 307/497; 365/208
[58] Field of Search ............... 307/530, 279, 355, 364, 307/497; 330/253, 257, 288; 365/205, 207, 208

[56] References Cited

U.S. PATENT DOCUMENTS

| | | | |
|---|---|---|---|
| 4,618,785 | 10/1986 | van Tran | 307/530 |
| 4,653,029 | 3/1987 | Sato | 330/257 |
| 4,791,324 | 12/1988 | Hodapp | 307/530 |

Primary Examiner—Stanley D. Miller
Assistant Examiner—Timothy P. Callahan
Attorney, Agent, or Firm—Lyon & Lyon

[57] ABSTRACT

The high-speed static differential sense amplifier of the present invention is composed of two stages. The first stage uses a source follower to feed a set of dual complimentary current mirrors. The current mirrors in the source of the input devices convert the voltage difference supplied by the source follower into a current. This current is mirrored into the second stage by opposing pull-down and pull-up current mirrors from the first stage. The second stage current difference produces the large voltage swings needed to drive the digital logic.

2 Claims, 1 Drawing Sheet

HIGH-SPEED STATIC DIFFERENTIAL SENSE AMPLIFIER

This application is a continuation-in-part of application Ser. No. 230,762 filed Aug. 10, 1988, entitled High-Speed Static Differential Sense Amplifier assigned to the same assignee as the present invention.

BACKGROUND OF THE INVENTION

1. Field Of The Invention

The present invention relates to integrated circuits and electronic circuits within integrated circuits used as sense amplifiers which find application in memory circuits such as random access memory, programmable read-only memory, and readonly memory to detect the presence or absence of an active memory signal. More particularly, the present invention is a high-speed static differential sense amplifier.

2. The Prior Art

The conventional voltage sensing static differential sense amplifier contains two data paths. Each data path has four branches divided into two stages. The two data paths are used to maintain a differential signal through the amplification chain. Maintaining a differential signal improves the noise margin by rejecting the common mode noise. Each stage uses two branches to double their effective input voltage, and thereby more than double their single-ended output voltage. To maintain a differential signal, a complimentary stage is necessary to produce a matching signal with the opposite polarity. Such an amplifier is shown in FIG. 1.

The conventional differential sense amplifier is relatively slow due to the large number of branches required to maintain a differential signal. For example, in the conventional design there are four branch delays between the input and the output. Some dynamic sense amplifiers have only two branch delays. Therefore, the conventional static differential sense amplifier design is inherently slower then the dynamic differential sense amplifier.

The conventional static differential sense amplifier also uses a large amount of current. There are eight branches consuming eight separate bias currents. If this sense amplifier were used in an eight output product there would be 64 separate branches consuming DC current. For products having multiple outputs, the output drive current of each branch must be sacrificed to control the current consumption which usually makes the sense amplifier slower since there is less current available to drive the load. One solution to this drive problem is to add another logic stage to regain the lost drive. However, adding such a stage only adds another delay and makes the product even slower.

BRIEF DESCRIPTION OF THE INVENTION

The high-speed static differential sense amplifier of the present invention is composed of two stages. The first stage uses a source follower to feed a set of dual complimentary current mirrors. The current mirrors in the source of the input devices convert the voltage difference supplied by the source follower into a current. This current is mirrored into the second stage by opposing pull-down and pull-up current mirrors from the first stage. The second stage current difference produces the large voltage swings needed to drive the digital logic.

The high-speed static differential sense amplifier of the present invention maintains the differential signal by using two current mirrors per branch to create complimentary signals. One mirror generates a positive signal from the branch current, while the other mirror generates a negative signal from the same branch current. As a result, it needs only half as many branches to obtain the same amount of amplification as a conventional sense amplifier. Furthermore, the high-speed static sense amplifier of the present invention has only two branch delays between the input and the output and it only has four branches consuming DC bias current. With half the branch delay and half the bias current for the same gain, the present invention has four times the speed power product as the conventional static differential sense amplifier, assuming comparable brance currents and loads.

The cross coupled current mirrors in the input stage of the differential sense amplifier of the present invention provide an additional voltage to current gain of up to two, typically between 1.5 to 2.0. These mirrors enhance the total amplifier gain such that an additional stage of amplification, with its associated delay and power consumption, is unnecessary.

DETAILED DESCRIPTION OF A PREFERRED EMBODIMENT

Figure 1:
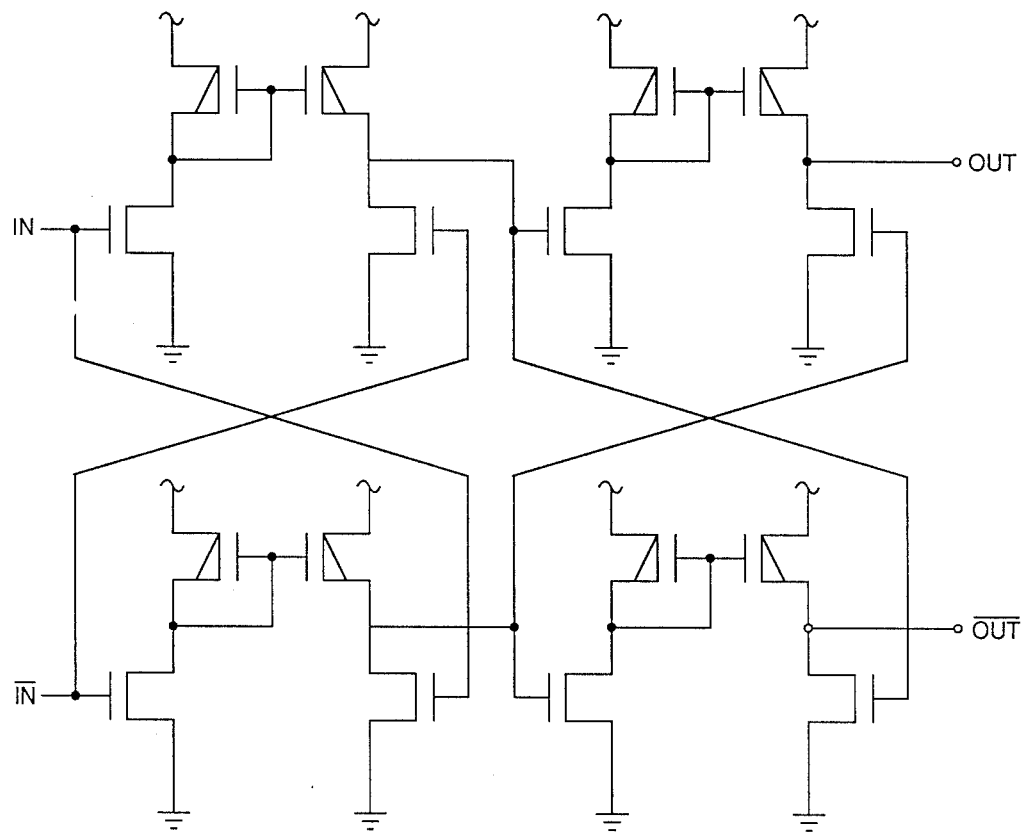
FIG. 1 is a schematic diagram of a typical prior art differential sense amplifier.
Figure 2:
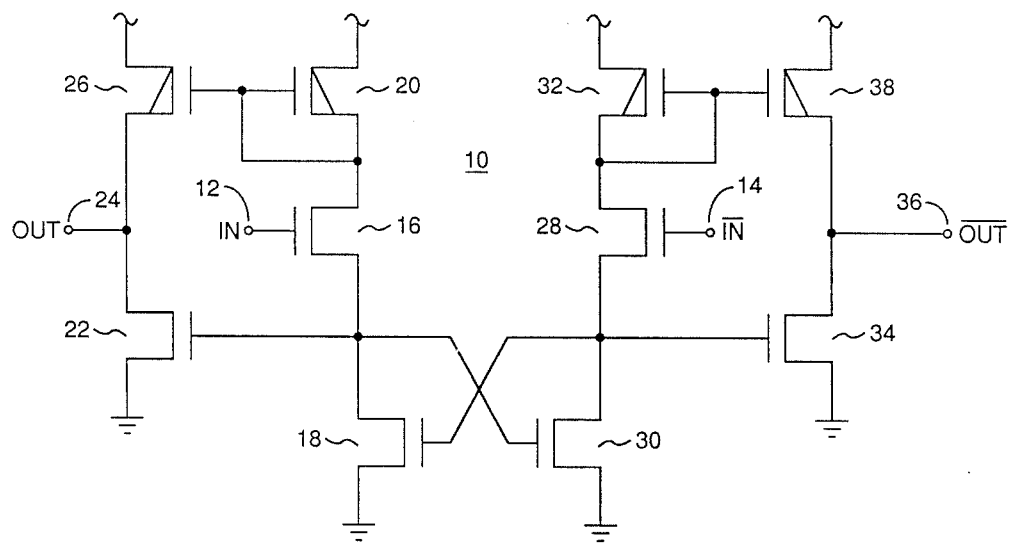
FIG. 2 is a schematic diagram of a presently preferred embodiment of a high speed differential sense amplifier according to the present invention.

Referring now to FIG. 2, a schematic diagram of a preferred embodiment of the differential sense amplifier of the present invention, has a first input node 12 and a second complimentary input node 14. Input node 12 is connected to the gate of first source follower N-channel transistor 16. The source of first source follower N-channel transistor 16 is connected to the drain of first cross coupled N-channel transistor 18. The source of first cross coupled N-channel transistor 18 is connected to a source of negative voltage Vss. The drain of first source follower N-channel transistor 16 is connected to the gate and drain of first P-channel transistor 20. The source of first P-channel transistor 20 is connected to a source of positive voltage Vdd. The source of first source follower transistor 16 is also connected to the gate of first N-channel mirror transistor 22. The source of first N-channel mirror transistor 22 is connected to Vss. The drain of first N-channel mirror transistor 22 is connected to output node 24. A second P-channel transistor 26 has its source connected to Vdd, its drain connected to output node 24, and its gate connected to the gate of the first P-channel transistor 20.

Complimentary input node 14 is connected to the gate of second source follower transistor 28. The source of second source follower transistor 28 is connected to the drain of second cross coupled transistor 30. The source of second cross coupled transistor 30 is connected to Vss. The gate of second cross coupled transistor 30 is connected to the drain of first cross coupled transistor 18. The gate of first cross coupled transistor 18 is connected to the drain of second cross coupled transistor 30. The drain of second source follower transistor 28 is connected to the drain and gate of third P-channel transistor 32. The source of third P-channel transistor 32 is connected to Vdd.

The source of second source follower transistor 28 is also connected to the gate of second N-channel mirror transistor 34. The source of second N-channel mirror transistor 34 is connected to Vss. The drain of second N-channel mirror transistor 34 is connected to output node 36. Fourth P-channel transistor 38 has its source connected to Vdd, its drain connected to output node 36 and its gate connected to the gate and drain of third P-channel transistor 32.

First and second P-channel transistors 20 and 26 form a first pull-up current mirror. Third and fourth P-channel transistors 32 and 38 form a second pull-up current mirror. First cross coupled N-channel transistor 18 and second N-channel transistor 34 form a first pull-down current mirror and second cross coupled transistor 30 and first N-channel transistor 22 form a second pull-down current mirror.

The first stage (input stage) of the amplifier of the present invention is composed of a dual set of source followers feeding two sets of current mirrors. The outputs of these current mirrors compose the second stages. N-channel transistors 16 and 28 are the source followers. N-channel transistors 18, 30, 34, and 22 compose the pull down current mirrors. N-channel transistors 18 and 30 are the current reference stages for output N-channel transistors 34 and 22, respectively. P-channel transistors 20, 26, 32, and 38 compose the pull up current mirrors. P-channel transistors 20 and 32 are the current reference stages for output P-channel transistors 26 and 38, respectively.

The output current (and, hence, output voltage if the load is resistive or capacitive), is a function of the difference in current flowing through N-channel devices 16 and 28. Current flowing through N-channel device 16 is mirrored via P-channel devices 20 and 26 as the pull up current on output node 24; and it is mirrored via N-channel devices 18 and 34 as the pull down current on output node 36. Current flowing through N-channel device 28 is mirrored via P-channel devices 32 and 38 as the pull up current on output node 36; and it is mirrored via N-channel devices 30 and 22 as the pull down current on output node 24. Therefore, the current flowing out of node 24 is a function of the current through device 16 minus the current through device 28, and the current flowing out of node 36 is a function of the current through device 28 minus the current through device 16.

If all of the devices sizes are the same, then the ideal output current is equal to the difference in the currents flowing in N-channel devices 16 and 28. If the outputs need more current (for example, to rapidly switch a large capacitive load), then the output stages (devices 22, 26, 34, and 38) could use larger transistors than the input stage, as long as all of their device sizes were the same multiple of their mating input stage devices. For example, if P-channel devices 20 and 32 were 25 microns wide, and N-channel devices 18 and 30 were 10 microns wide, and the output current needed to be three times the difference current of the input stage; then P-channel devices 26 and 38 would be 75 microns wide (three times the width of P-channel devices 20 and 32, respectively), and N-channel devices 22 and 34 would be 30 microns wide (three times the width of N-channel devices 30 and 18, respectively).

The input voltage is fed to the sources of devices 16 and 18, which feed the reference stage of a cross coupled current mirror composed of devices 18 and 30. This current mirror allows the source followers to produce a voltage gain of greater than one by using the positive feedback of the cross-coupled transistors. Gains of up to approximately four are achievable by adjusting the ratio of the width of the source follower devices 16 and 28 to the width of the cross coupled devices 18 and 30. Above gains of approximately four, the possibility of latching devices 18 and 30 becomes a problem. For instance, at a 1:2 ratio latching can occur; which at a 1:1 ratio, the gain is approximately four for a 100 mv differential input.

Additional gain comes at the cost of some speed. Since the gain bandwidth product of the circuit is a nearly constant, and speed is proportional to bandwidth, changing one of its terms, i.e., gain or bandwidth, affects the other. For example, while a 1:1 ratio has a gain of four, it switches more slowly than a 2:1 ratio with its gain of approximately 1.5.

Those of ordinary skill in the art will recognize readily that the device ratios will need to be optimized for particular processes because of back-gate bias effects, threshold tracking, gain mismatches, and power supply range. Standard modeling techniques will readily yield optimum device ratios for particular processes.

The signal current, which is mirrored into the output stages, is a function of the square of the voltage applied to the reference stages of the current mirrors; so an increase in the source follower voltage gain becomes a squared increase in the amplifier's voltage to current gain. Gain can be translated into speed and/or power. Therefore, the cross coupled pull down current mirrors are used to further increase the speed power product of this sense amplifier.

A presently-preferred embodiment of the present invention has been disclosed. Those of ordinary skill in the art will readily see how the present invention may be modified without departing from the spirit of the teachings herein. Therefore, it is intended that the scope of the present invention be limited only by the appended.

What is claimed is

1. A high-speed static differential sense amplifier, including:
    a noninverting input node,
    an inverting input node,
    an inverting output,
    a non-inverting output,
    a first source follower connected to said noninverting input node,
    a second source follower connected to said inverting input node,
    a first pull-up current mirror having a current reference portion connected to said first source follower and an output driver portion connected to said noninverting output,
    a second pull-up current mirror having a current reference portion connected to said second source follower and an output driver poriton connected to said inverting output,
    a first pull-down current mirror having a current reference portion connected to said second source follower and an output driver portion connected to said noninverting output,
    a second pull-down current mirror having a current reference portion connected between said first source follower and an output driver portion connected to said noninverting output.

2. A high-speed static differential sense amplifier, including:
- a noninverting input node,
- an inverting input node,
- a first N-channel input transistor having its gate connected to said noninverting input node,
- a second N-channel input transistor having its gate connected to said inverting input node,
- a third N-channel input transistor having its source connected to a source of negative voltage and its drain connected to the source of said first N-channel input transistor,
- a fourth N-channel input transistor having its source connected to a source of negative voltage, its gate connected to the drain of said third N-channel input transistor and its drain connected to the source of said second N-channel input transistor and to the gate of said third N-channel input transistor,
- a first P-channel input transistor having its source connected to a source of positive voltage, its drain and gate connected to the drain of said first N-channel input transistor,
- a second P-channel input transistor having its source connected to a source of positive voltage and its drain and gate connected to the drain of said second N-channel input transistor,
- a first N-channel output transistor having its source connected to a source of negative voltage, its gate connected to the source of said first N-channel input transistor and its drain connected to a noninverting output node,
- a first P-channel output transistor having its source connected to a source of positive voltage, its gate connected to the drain of said first N-channel input transistor and its drain connected to said noninverting output node,
- a second N-channel output transistor having its source connected to a source of negative voltage, its gate connected to the source of said second N-channel input transistor and its drain connected to an inverting output node,
- a second P-channel output transistor having its source connected to a source of positive voltage, its gate connected to the drain of said second N-channel input transistor and its drain connected to said inverting output node.

* * * * *